US007005215B2

(12) United States Patent
Pierrat

(10) Patent No.: US 7,005,215 B2
(45) Date of Patent: Feb. 28, 2006

(54) MASK REPAIR USING MULTIPLE EXPOSURES

(75) Inventor: Christophe Pierrat, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 174 days.

(21) Appl. No.: 10/282,483

(22) Filed: Oct. 28, 2002

(65) Prior Publication Data

US 2004/0081896 A1   Apr. 29, 2004

(51) Int. Cl.
  *G03F 9/00*   (2006.01)
  *G03C 5/00*   (2006.01)
  *H01L 47/02*  (2006.01)

(52) U.S. Cl. .................... 430/5; 430/312; 430/313; 430/316; 430/30; 257/6
(58) Field of Classification Search ............. 430/5, 430/312, 313, 323, 30, 316; 257/6
See application file for complete search history.

(56) References Cited

U.S. PATENT DOCUMENTS

| 4,231,811 | A |   | 11/1980 | Somekh et al. |
| 5,922,497 | A |   | 7/1999  | Pierrat |
| 5,981,110 | A | * | 11/1999 | George et al. ............... 430/5 |
| 6,096,458 | A |   | 8/2000  | Hibbs |

FOREIGN PATENT DOCUMENTS

WO   WO 02/29491 A1   4/2002

* cited by examiner

*Primary Examiner*—Saleha R. Mohamedulla
(74) *Attorney, Agent, or Firm*—Bever, Hoffman & Harms, LLP; Jeanette S. Harms

(57) ABSTRACT

A mask fabrication and repair technique including multiple exposures is provided. In this multiple exposure technique, the first exposure can define the critical dimensions (CDs) of the shapes for the mask. A subsequent exposure can eliminate isolated defects and significantly reduce the size of defects proximate to the desired shapes on the mask. Because similar processes (i.e. forming, exposing, and developing a photoresist layer) are used for creating and repairing the mask, certain repair-related defects, such as phase and transmission defects, can be minimized. Wafer repair can also be performed using the same multiple exposure technique.

24 Claims, 6 Drawing Sheets

MASK REPAIR USING MULTIPLE EXPOSURES

BACKGROUND OF THE INVENTION

1. Field of the Invention

The invention relates to mask repair and particularly to performing mask repair using a multiple exposure technique.

2. Discussion of the Related Art

In designing an integrated circuit (IC), engineers can use computer simulation tools to help create a circuit design. The circuit design consists of individual devices coupled together to provide certain functions. To fabricate this circuit in a semiconductor substrate on a wafer, the circuit design is translated into a layout. Computer aided design (CAD) tools can assist layout designers in the task of translating the discrete circuit elements (such as gate electrodes, field oxidation regions, diffusion regions, metal interconnections, etc.) into shapes in the layout that implement these circuit elements.

The layout can be transferred onto the semiconductor substrate using optical lithography. Specifically, for each layer of the circuit design, a radiation (e.g. light) source is shone on a mask (wherein the term mask can also refer herein to a reticle) corresponding to that layer. This radiation passes through clear, e.g. quartz, regions of the mask and is blocked by opaque, e.g. chrome, regions of the mask, thereby selectively exposing a photoresist layer on the wafer. The photoresist layer can then be developed and the semiconductor layer underlying the photoresist can be etched, thereby creating a pattern that defines the shapes of that layer. This process can be repeated for each layer of the circuit design.

As circuit designs become more complicated, it becomes increasingly important that the masks used in photolithography can accurately transfer the layout to the wafer. Unfortunately, the machines used to manufacture these masks cannot do so without error. In fact, in a typical manufacturing process, some mask defects do occur outside the controlled process.

A defect on a mask is anything that is different from the circuit design and is deemed unacceptable by an inspection tool or an inspection engineer. If there are no defects, or defects are detected but determined to be within tolerances set by the manufacturer or end-user, then the mask can be used to expose a wafer. However, if defects are detected that fall outside tolerances, then the mask fails the inspection, and a decision must be made as to whether the mask can be repaired to correct the defects, or whether the defects are so severe that a new mask must be manufactured. This process is continued until a manufactured mask passes the inspection.

The repair of an area on a mask that is erroneously covered with chrome entails the removal of such chrome. Three types of repair tools can be used to repair a mask with chrome defects: a focused ion beam tool, an optical tool, or a micro-chisel tool. Of these tools, the focused ion beam is most frequently used because it provides the best imaging capability of the defect area as well as the best accuracy due to its small spot size. Unfortunately, as a result of these features, a repair of each defect using the focused ion beam may take up to an hour. As the mask itself takes approximately twelve hours to make, the decision to repair versus making a new mask can be contingent on the number of defects identified. For example, if ten defects falling outside tolerances are identified on the mask, then a mask shop may decide to manufacture a new mask rather than try to repair the mask.

Of importance, trying to repair a mask does not guarantee that the defects can be eliminated. Specifically, stopping a repair process too soon can leave residual chrome on the mask, whereas stopping a repair process too late can cause phase or transmission defects on the mask. For example, during a repair operation using the above-described tools, some portion of the exposed quartz surface could be removed, thereby resulting in an undesirable difference of phase between the "repaired" area and its surrounding area. Both phase and transmission defects can adversely affect feature printing on the wafer.

Therefore, a need arises for a commercially viable technique that can successfully repair a mask without causing phase and/or transmission defects.

SUMMARY OF THE INVENTION

A mask fabrication and repair technique including multiple exposures is provided. In this multiple exposure technique, the first exposure can define the critical dimensions (CDs) of the shapes for the mask. A subsequent exposure can eliminate isolated defects and significantly reduce the size of defects proximate to the shapes on the mask. Because similar processes (i.e. forming, exposing, and developing a photoresist layer) are used for creating and repairing the mask, certain repair-related defects, such as phase and transmission defects, can be minimized.

In accordance with one feature of the invention, a first layer on the mask provides a stop-etch for a second layer formed on the first layer. For example, the first layer could include quartz and the second layer could include chrome. The technique can include forming a first photoresist layer on the second layer. The first photoresist layer can be exposed based on a first pattern including a plurality of shapes defined in the layout of the mask. The first photoresist layer can then be developed, thereby defining critical dimensions of the shapes. At this point, the second layer can be etched, thereby transferring the desired pattern of shapes to the second layer.

In accordance with one feature of the invention, a second photoresist layer can be formed on the patterned second layer. The second photoresist layer can be exposed based on a second pattern. In one embodiment, the first and second patterns are substantially identical. The second photoresist layer can then be developed. At this point, the second layer can be re-etched, thereby removing at least one defect on the mask.

In one embodiment, the second photoresist layer is a positive photoresist. To compensate for any misalignment between exposures in this embodiment, developing can include under-processing of the second photoresist layer, thereby allowing the defect to be exposed and etched away while protecting the desired shapes in the patterned second layer. In another embodiment of the invention, to compensate for misalignment, the data associated with the second pattern can be sized up.

In yet another embodiment, the second photoresist layer is a negative photoresist. If the first layer is substantially transparent, then the technique can further include exposing the backside of the first layer after exposing the second photoresist layer using the second pattern, but before developing the second photoresist layer. To compensate for any misalignment between exposures in this embodiment, the second photoresist layer can be over-exposed. In one embodiment, etching and re-etching the second layer can include anisotropic etches. In another embodiment, etching the second layer can include an anisotropic etch and re-etching the second layer can include an isotropic etch.

If a negative photoresist is used, the technique can further include inspecting the mask after etching the second layer and receiving defect location information based on the step of inspecting. In this case, the second pattern can be limited to defect locations on the mask.

Thus, a mask fabrication and repair technique can advantageously use substantially the same technique for transferring a pattern onto a mask and for reducing defects on the mask. The technique includes exposing and developing a photoresist layer as well as etching a layer underlying the photoresist layer. Protecting the desired shapes of the transferred pattern can be done by under-processing as the photoresist is being developed or over-exposing as the photoresist is being exposed or by sizing the data. To minimize misalignment between exposures, the technique can include providing alignment keys during the first exposure.

Of importance, both masks and wafers can be made using the multiple exposure technique, thereby minimizing phase or transmission defects as well as repair operations. A mask/wafer that was made using the multiple exposure technique has few or no isolated defects, but may have some small defects proximate to the desired shapes on the mask/wafer. The multiple exposure technique can include the steps of forming a first photoresist layer on a layer of the mask/wafer, exposing the first photoresist layer based on a first pattern including a plurality of shapes, and then developing the first photoresist layer. At this point, the mask/wafer layer can be etched, thereby transferring the pattern to the mask/wafer layer. In accordance with a feature of the invention, a second photoresist layer can then be formed on the patterned mask/wafer layer. The second photoresist layer can be exposed based on a second pattern associated with the first pattern. After development of the second photoresist layer, the patterned mask/wafer layer can be re-etched, thereby at least partially removing a defect on the mask/wafer.

DETAILED DESCRIPTION OF THE DRAWINGS

In accordance with one feature of the invention, the same technique used for making a mask, i.e. depositing, exposing, and developing a photoresist layer, can be used to eliminate defects on the mask. In this multiple exposure technique, the first exposure can define the critical dimensions (CDs) of shapes for a mask layer. A subsequent exposure can eliminate isolated defects and significantly reduce the size of defects proximate to the shapes on the mask layer. The multiple exposure technique can eliminate, or at least minimize, phase or transmission defects that could be created using standard repair tools.

Figure 1A:
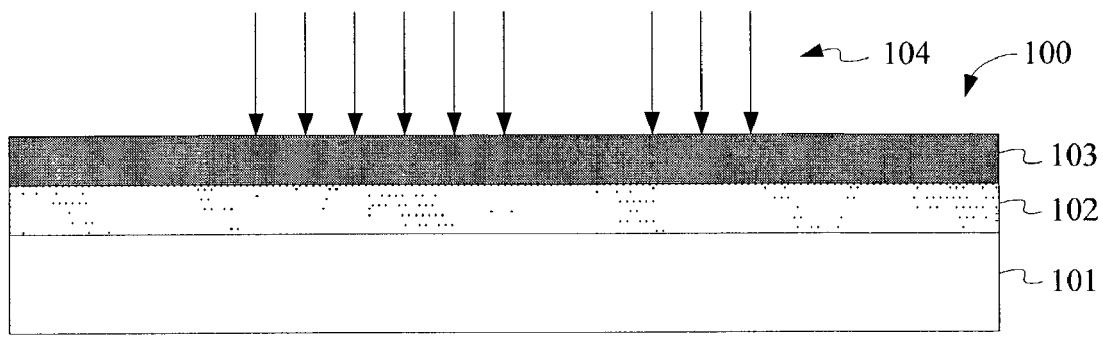
FIGS. 1A–1F illustrate an exemplary technique for fabricating and repairing a mask by performing a multiple exposure of the mask. The second exposure uses a positive photoresist.

FIG. 1A illustrates a cross sectional view of an exemplary mask including a quartz layer (forming the substrate) 101, a chrome layer 102 formed on quartz layer 101, and a photoresist layer 103 formed on chrome layer 102. To transfer a pattern onto mask 100 using photoresist layer 103, radiation (e.g. ebeam or UV radiation) 104 can selectively expose photoresist layer 103, which can be either a positive or a negative photoresist.

The areas in photoresist layer 103 exposed to radiation 104 (i.e. irradiated areas) are either soluble or insoluble in a specific solvent, called a developer. If the irradiated areas are soluble, then a positive image of the pattern is produced in photoresist layer 103. Thus, such a photoresist is called a positive photoresist. In contrast, if the irradiated areas are insoluble, then a negative image of the pattern is produced in photoresist layer 103. Thus, such a photoresist is called a negative photoresist. In FIGS. 1A–1F, photoresist layer 103 is assumed to be a positive resist for illustration purposes, but could be a negative photoresist in other embodiments.

Figure 1B:
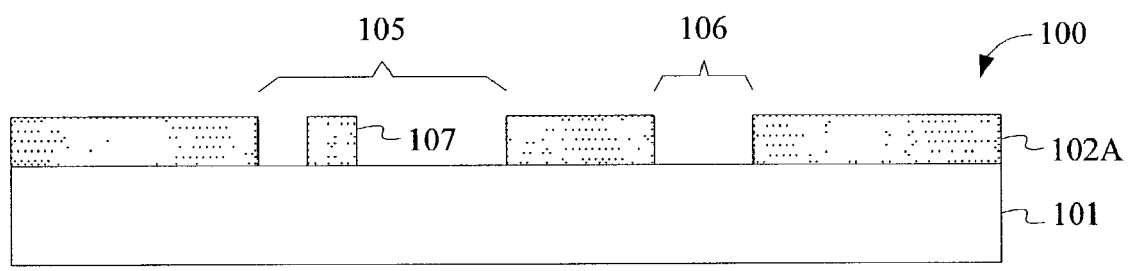

After development of photoresist layer 103, the regions of chrome layer 102 no longer covered by photoresist can be removed by an anisotropic etch, thereby transferring a pattern onto mask 100. This etching is then followed by a photoresist stripping step and a cleaning step. FIG. 1B illustrates mask 100 after these etching, stripping, and cleaning steps. Specifically, mask 100 now includes a patterned chrome layer 102A, wherein the desired pattern includes two openings 105 and 106 that expose quartz layer 101. Unfortunately, a defect 107 is also present in mask 100.

Figure 1C:
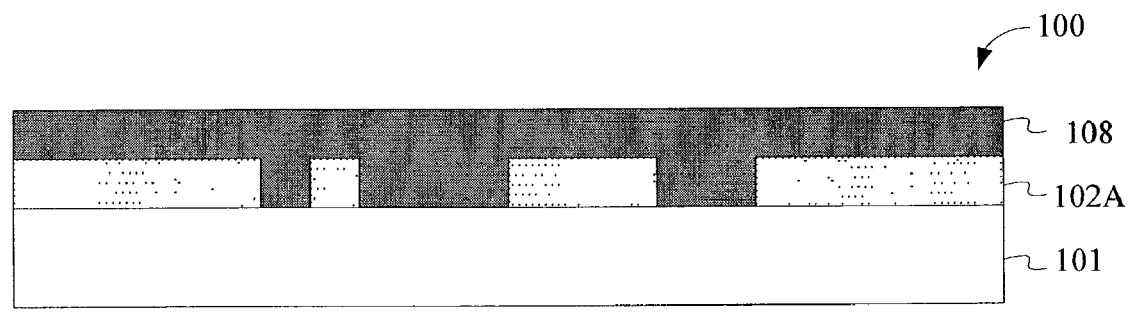
Figure 1D:
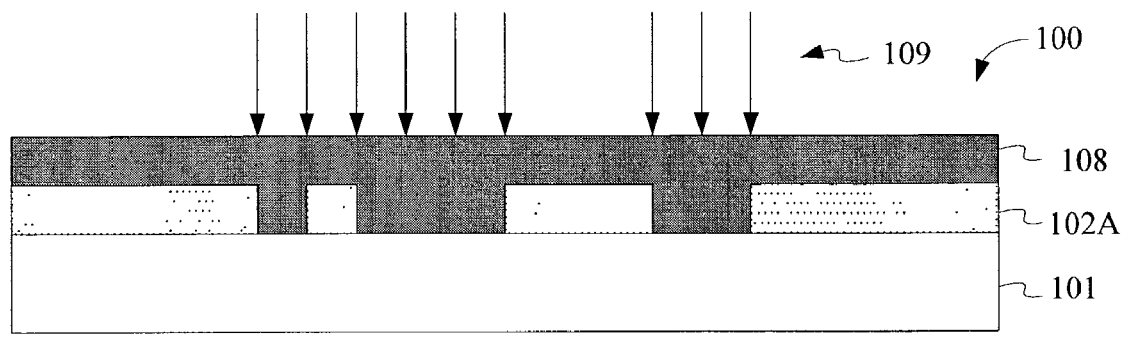
Figure 1E:
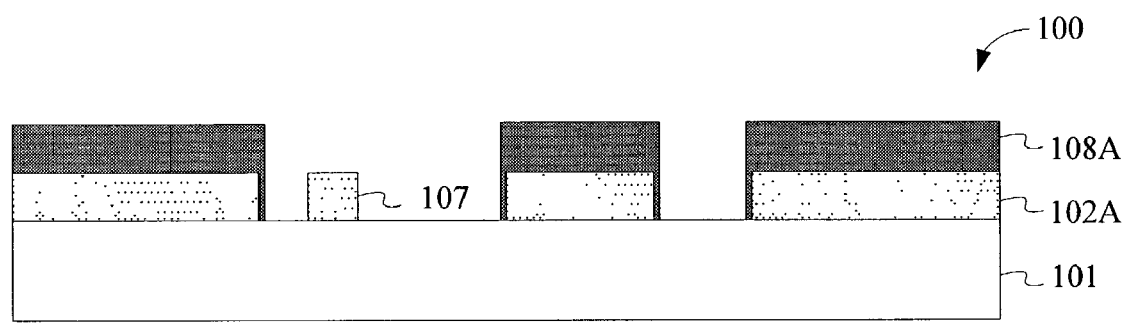

In accordance with one embodiment of the invention, a second positive photoresist layer 108 can be formed on patterned chrome layer 102A as shown in FIG. 1C. At this point, as shown in FIG. 1D, second positive photoresist layer 108 can be exposed with the same pattern used for the exposure of the first positive photoresist layer (i.e. positive photoresist layer 103 in FIG. 1A). In some embodiments, portions of the pattern are intentionally biased (i.e. under-sized or oversized) to better compensate for misalignment. This second exposure can include a re-alignment to ensure that the desired pattern already present in patterned chrome layer 102A is preserved.

In one embodiment, second photoresist layer 108 is under-processed (i.e. under-developed). Note that second photoresist layer 108 could be under-exposed to achieve the same result. Specifically, and referring to FIG. 1E, developed photoresist layer 108A covers the edges of the desired shapes of patterned chrome layer 102A. Thus, even assuming some misalignment between first and second exposures, the desired shapes already present in patterned chrome layer 102A can be protected during subsequent processing.

Figure 1F:
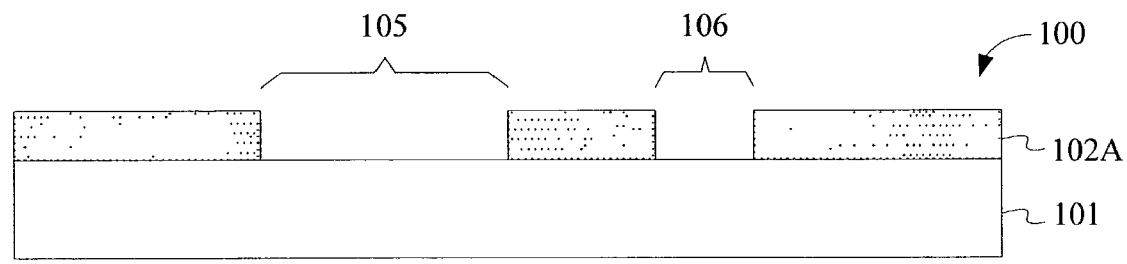

Specifically, a chrome etch performed at this point can remove the isolated defects, such as defect 107, in patterned chrome layer 102A. Of importance, quartz is an etch-stop to this chrome etch, thereby ensuring that defect removal does not result in phase or transmission defects in quartz layer 101. FIG. 1F illustrates mask 100 after this chrome etch, photoresist stripping, and cleaning. Advantageously, mask 100 now exhibits the desired pattern of openings 105 and 106 without any defect(s) therein.

In another embodiment of the invention, FIGS. 2A–2D illustrate a repair technique using negative photoresist for the second exposure. In one embodiment, the first exposure as shown in FIGS. 1A and 1B can be performed. Specifically, referring back to FIGS. 1A–1B, radiation 104 can selectively expose positive photoresist 103 to transfer a pattern onto mask 100. (Note that the pattern could also be transferred using a negative photoresist with radiation 104 directed to areas opposite to those indicated in FIG. 1A.) After development of photoresist layer 103, the regions of chrome layer 102 no longer covered by photoresist are removed by etching, thereby transferring a pattern onto mask 100. This etching is then followed by a photoresist stripping step and a cleaning step. As described previously, FIG. 1B illustrates mask 100 after these stripping and cleaning steps.

Figure 2A:
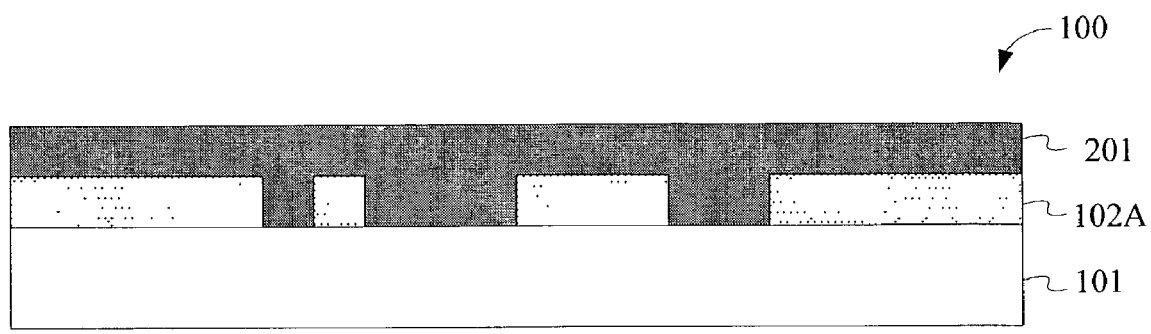
FIGS. 2A–2D illustrate another exemplary technique for repairing a mask by performing an exposure of the mask. The second exposure uses a negative photoresist.
Figure 2B:
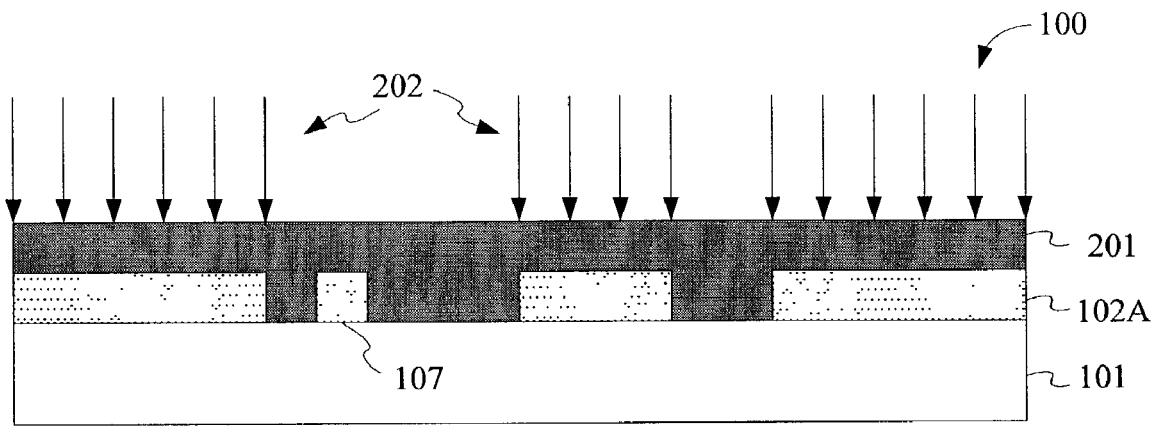

Then, referring to FIG. 2A, a negative photoresist layer 201 is formed on patterned chrome layer 102A. As shown in FIG. 2B, radiation 202 can selectively expose negative photoresist 201. Note that in the case of negative photoresist, radiation 202 is directed to areas coincident with the desired shapes in patterned chrome layer 102A. Thus, the area of negative photoresist 201 formed over defect 107 does not receive radiation 202 because this area should be free of chrome.

At this point, negative resist layer 201 can be overexposed, i.e. the data sized up. Over-exposure can protect the desired shapes already provided by patterned layer 102A in case of misalignment between the first and second exposures. Note that this over-exposure or sizing up can be dependent on the tool used for manufacture and the quality of the realignment. In one embodiment using a focused ion beam, a margin of 60–100 nm at each edge of a desired shape can be used.

Figure 2C:
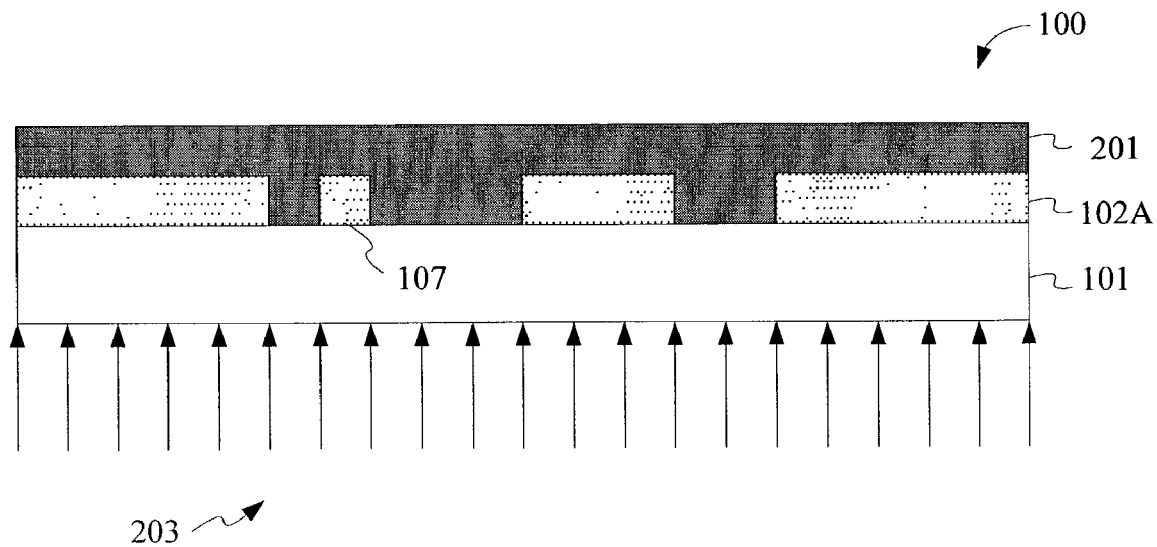

In one embodiment shown in FIG. 2C, before development of photoresist layer 201, a third exposure using radiation 203 can be directed through the backside of mask 100, i.e. via quartz layer 101. In this manner, patterned chrome layer 102A serves as a block to radiation 203. Thus, after exposure to radiation 203, the only soluble areas of photoresist layer 201 are located directly above any defects (such as defect 107).

Figure 2D:
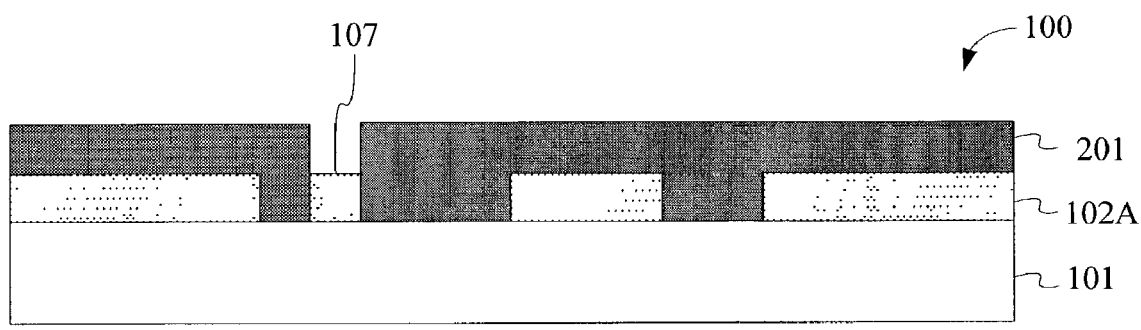

FIG. 2D illustrates mask 100 after exposure to radiation 202 and 203 as well as development of negative photoresist layer 201. Note that this embodiment is advantageously self-aligned based on the edges of any defects in patterned chrome layer 102A. In this manner, after development, only the defects of patterned chrome layer 102A, e.g. defect 107, are exposed. At this point, a subsequent chrome etch will remove defect 107, thereby ensuring that the desired pattern on mask 100 is preserved. Once again, this etching can be followed by a photoresist stripping step and a cleaning step. FIG. 1F illustrates mask 100 after these stripping and cleaning steps.

Note that in either embodiment using a second exposure, removal of a defect that occurs next to a desired feature in patterned chrome layer 102A can be limited by compensation for misalignment. For example, assume a predetermined amount, e.g. N nm, of over-sizing or under-sizing, is used in the second exposure to compensate for misalignment. In this case, if a defect is within M nm of a desired shape in the patterned chrome layer, wherein M is less than N, then a portion of that defect may be left after the chrome etch. However, either embodiment can significantly decrease the size of such defect, thereby minimizing the mask area(s) that would need to be repaired as well as the time associated with such repair. Note that in other embodiments, a predetermined amount, e.g. Q milli-Joules/cm$^2$, of over-exposure or under-exposure could be used in a similar manner to compensate for misalignment.

The second exposure technique can be applied to any mask, even before inspection of the mask is performed. This pre-inspection technique can result in fewer masks being rejected. For example, assume that the second exposure technique is used on a mask that has X original defects, wherein X is greater than the maximum allowable number of defects for a repairable mask. Advantageously, because the second exposure technique removes a majority of those defects and significantly reduces the area of any remaining defects, such a mask can be repaired instead of being rejected. In this manner, the second exposure technique can result in significant cost savings to mask shops.

Note that the second exposure technique can be modified depending on the type of mask being repaired. For example, if the mask is an attenuated PSM (which includes attenuated material instead of chrome), then the dosage used for the backside exposure (see FIG. 2C) can be reduced compared to the dosage used for a binary mask (which includes chrome).

In one embodiment, alignment keys can be created in association with the first exposure, thereby minimizing misalignment with the second exposure. An alignment key could include measurements taken from various sides of the mask, thereby ensuring that radiation 109/202 is accurately applied to photoresist layer 108/201.

Because quartz is an etch-stop to the chrome etch, the multiple exposure technique advantageously minimizes any adverse effect on the quartz substrate. Specifically, the multiple exposure technique with an etch-stop, unlike previous prior art techniques using a mechanical repair process, cannot create any phase or transmission defects in the mask (but see discussion below regarding imperfect etch stops). Thus, of importance, the multiple exposure technique can be performed on any mask, e.g. binary, PSM, etc., in which a stop-etch layer is available.

In one embodiment of the invention, different exposure techniques can be used for each exposure. In general, shapes of the mask can be exposed with an electron beam using a raster scan or a vector scan. In a raster scan, the output of the scanner is moved in horizontal passes across the entire mask and shifted an increment downwards after each pass, with the electron beam being applied to regions where the resist is to be exposed. The "spot size" of the electron beam can be set small to enable precise scanning of the mask layout. However, a larger spot size may be desirable to speed up the scanning process. Therefore, accuracy and throughput must be traded off against one another in conventional raster scan writing processes.

In a vector scan, the electron beam is moved directly to regions that are to be exposed. Most modern vector scan systems employ a shaped spot technique, wherein the electron beam is formed into various primitive shapes (rectangles and triangles). The regions to be exposed are decomposed into primitives (rectangles and triangles), and each primitive is then exposed in a single shot by the electron beam, which is shaped to match the primitive being exposed. Vector scanning can be more efficient than raster scanning because the write tool does not have to scan the entire surface of the mask. Therefore, a sparse layout will be written much faster with a vector scan than a raster scan. However, individually targeting the many features in a dense, complex layout can result in a vector scan taking longer to write the layout than a raster scan. And as with raster scanning, beam spot size selection still must balance accuracy and throughput.

In the multiple exposure technique, the first exposure (with either positive or negative photoresist) could be performed using a raster scan having a medium spot size. In contrast, the second exposure with positive photoresist could be performed using a vector scan. Specifically, because radiation is directed to spaces between desired shapes on the layer, the vector scan could be efficiently used with a densely populated layer. The second and third exposures with negative photoresist could be performed with a raster scan having a large spot size. This large spot size can be used because the third exposure targets the defects in the etched layer. (In one embodiment, the second exposure data could also be snapped to a larger grid.) Note that the large spot size is particularly efficient when mainly isolated defects are present. In cases where a majority of the defects are proximate to desired shapes in the layer, the raster scan in the second exposure could have a medium spot size, thereby ensuring that the down-sizing of such defects is maximized.

Figure 3:
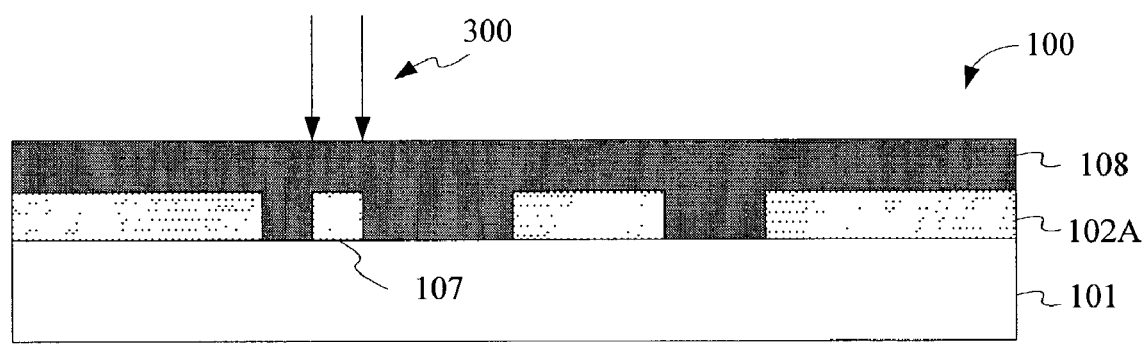
FIG. 3 illustrates yet another exemplary repair technique using an exposure, wherein the exposure can use information from a defect map to target defects.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, in one embodiment shown in FIG. 3, the second exposure of the multiple exposure technique using positive photoresist could be performed after inspection. Specifically, defect information (e.g. a defect map) provided by an inspection tool could be used to perform a local, not global exposure. Specifically, radiation 300 could expose the area directly above defect 107 (e.g. using a vector scan technique). Thus, radiation 300 operating on positive photoresist could target specific defects as does the technique using negative photoresist (see FIG. 2D). In one embodiment, a bias can be added to ensure that even if misalignment occurs, the entire defect will be removed in the subsequent etch step.

Figure 4A:
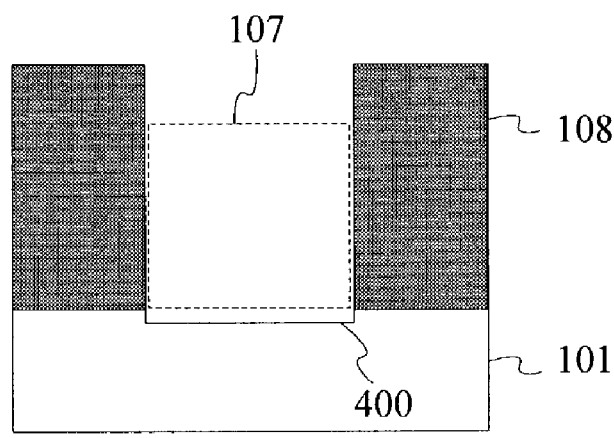
FIG. 4A illustrates a potential problem with over-etching of a quartz layer, assuming that the quartz layer is less than a perfect etch-stop.
Figure 4B:
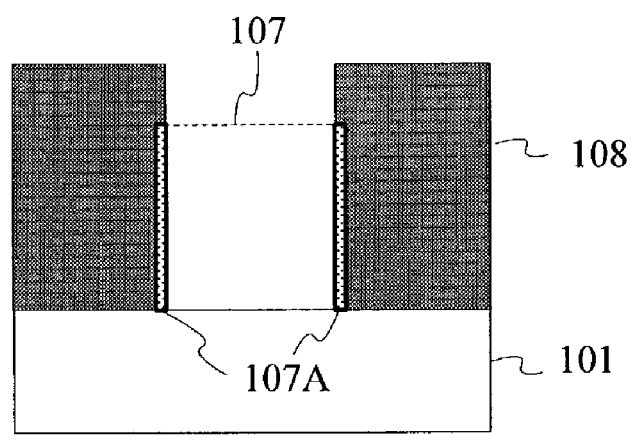
FIG. 4B illustrates a potential problem with under-development of the photoresist in the embodiment shown in FIG. 3, thereby creating undesirable residual structures during a subsequent anisotropic etch.
Figure 4C:
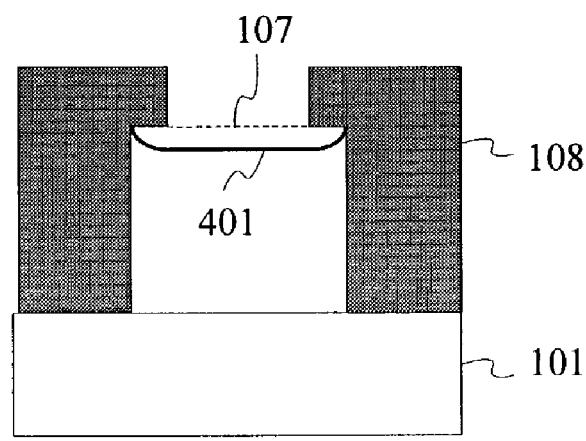
FIG. 4C illustrates a solution to the under-development of the photoresist in FIG. 4B. Specifically, potential undesirable residual structures can be eliminated using an isotropic etch.

FIG. 4A illustrates a potential problem with over-etching. Specifically, assuming that quartz layer 101 is less than a perfect etch-stop, then some etching 400 may occur in quartz layer 101 when defect 107 (shown for clarity) is removed (for example, after defect 107 is exposed as in FIG. 2D). FIG. 4B illustrates a potential problem with under-development of photoresist layer 108 in the embodiment shown in FIG. 3. Specifically, if photoresist layer 108 is underdeveloped, then thin vertical defects 107A may be left when defect 107 (once again, shown for clarity) is removed using an anisotropic etch. Therefore, in another embodiment shown in FIG. 4C, an isotropic etch 401 (or a partially isotropic etch), not an anisotropic etch, can be performed on defect 107 subsequent to an under-development of photoresist layer 108. In this manner, areas of defect 107 (shown for clarity) previously protected by an overhang of photoresist layer 108 can be removed. In one embodiment, isotropic etch 401 can be a wet etch.

Figure 5:
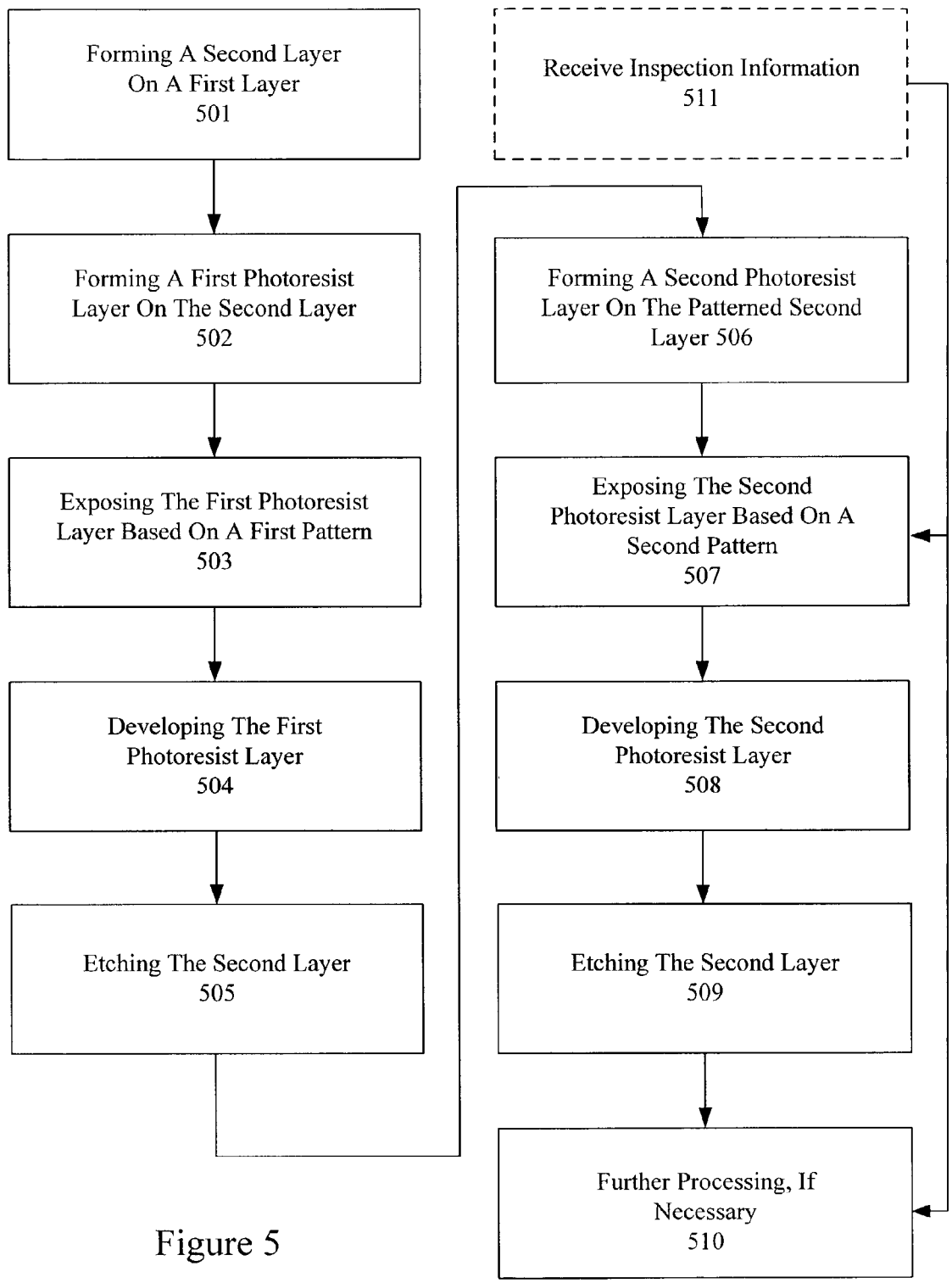
FIG. 5 illustrates a simplified mask/wafer manufacturing process including the multiple exposure technique.

In yet another embodiment, the multiple exposure technique could be applied to a wafer. FIG. 5 illustrates a simplified mask/wafer manufacturing process including the multiple exposure technique. This process can include forming a second layer on a first layer in step 501. Of importance, the first layer provides a stop-etch for the second layer. The process can include forming a first photoresist layer on the second layer in step 502. The first photoresist layer can be exposed in step 503 based on a first pattern including a plurality of shapes. The first photoresist layer can be developed in step 504, thereby defining critical dimensions of the plurality of shapes. The second layer can be etched in step 505, thereby transferring the pattern to the second layer.

The process can further include forming a second photoresist layer on the patterned second layer in step 506. The second photoresist layer can be exposed in step 507 based on a second pattern, the second pattern being associated with the first pattern. (Note that the backside exposure, such as that shown in FIG. 2C, would not be appropriate to fabricate a wafer, which has an opaque first layer.) The second photoresist layer can be developed in step 508. The second layer can be etched in step 509, thereby removing one or more isolated defects on the mask and reducing the size of defects proximate to the shapes in the patterned second layer. Further processing can be performed in step 510, if necessary. For example, if a wafer is being made, one or more additional layers can be formed using similar or different techniques. Note that this process can be repeated any number of times, as needed.

Further note that the timing and order of the steps in FIG. 5 can depend on various factors, e.g. decisions of the mask shop and/or wafer fabrication facility. For example, assume that it takes 12 hours to perform steps 502–505 (i.e. transferring the pattern), 5 hours perform step 511 (i.e. inspecting that pattern), and 12 hours to perform steps 506–509 (i.e. removing defects using at least a second exposure). In this case, depending on how often one still had to spend the extra 12 hours performing steps 506–509, spending the 5 hours to inspect might be worthwhile to perform before starting steps 506–509.

Inspection information regarding defects in the second layer can be received in step 511. Note that the cost of an inspection tool can be quite substantial (e.g. on the order of millions or even tens of millions of dollars). Therefore, such an inspection tool should be judiciously used, thereby allowing the cost to be spread over as many masks/wafers as possible. The multiple exposure technique can ensure the most efficient use of an inspection tool by reducing the number of defects on the mask/wafer and significantly reducing the size of any remaining defects on the mask/wafer.

In one embodiment, this inspection information can be used when the second photoresist is exposed (step 506). For example, if an inspection is performed after etching of the first photoresist layer, but before forming the second photoresist layer on the patterned second layer, then the second pattern could include the defect locations (see FIG. 3). In another embodiment, the inspection information can be used during subsequent processing (step 510). For example, if an inspection is performed after etching of the second photoresist layer, then remaining defect locations, if any, could be provided to a standard repair tool.

Note that the discussion herein assumes that the defects on the mask are random rather than systematic (i.e. caused by one or more errors in the data). Further note that although chrome has been described herein as the opaque layer, other materials (e.g. molybdenum silicide) can also be used. The techniques described herein can be applied to masks and wafers for various lithographic process technologies, including ultraviolet, deep ultraviolet (DUV), extreme ultraviolet (EUV), x-ray, and ebeam. Accordingly, it is intended that the scope of the invention be defined by the following claims and their equivalents.

What is claimed is:

1. A method of minimizing defects when fabricating a mask, the mask including a first layer and a second layer formed on the first layer, wherein the first layer provides a stop-etch for the second layer, the method comprising:
   forming a first photoresist layer on the second layer;
   exposing the first photoresist layer based on a first pattern including a plurality of shapes;
   developing the first photoresist layer, thereby defining critical dimensions of the plurality of shapes;
   etching the second layer, thereby transferring the pattern to the second layer;
   forming a second photoresist layer on the patterned second layer;
   exposing the second photoresist layer based on a second pattern associated with the first pattern, wherein the second pattern is substantially identical to or opposite that of the first pattern;
   developing the second photoresist layer; and
   re-etching the second layer, thereby removing a defect on the mask.

2. The method of claim 1, wherein the first layer includes quartz and the second layer includes chrome.

3. The method of claim 1, wherein the second photoresist layer is a positive photoresist, wherein the second pattern is identical to the first pattern, and wherein developing includes under-processing the second photoresist layer, thereby exposing the defect.

4. The method of claim 3, further including aligning first and second exposures.

5. The method of claim 1, wherein the second photoresist layer is a negative photoresist.

6. The method of claim 5, wherein the first layer is substantially transparent, and further including exposing the backside of the first layer after exposing the second photoresist layer based on the second pattern and before developing the second photoresist layer.

7. The method of claim 6, wherein exposing the second photoresist layer based on the second pattern includes over-exposing the second photoresist layer.

8. The method of claim 7, further including aligning first and second exposures.

9. The method of claim 6, wherein etching the second layer includes an anisotropic etch and re-etching the second layer includes an isotropic etch.

10. The method of claim 1, wherein the first layer is substantially opaque.

11. The method of claim 1, wherein re-etching removes an isolated defect and reduces a size of a defect proximate to at least one of the plurality of shapes.

12. A mask fabrication and repair technique comprising:
   using a technique for transferring a pattern onto a mask; and
   using substantially the same technique for reducing defects on the mask.

13. The mask fabrication and repair technique of claim 12, wherein the technique includes:
   exposing a photoresist layer;
   developing the photoresist layer; and
   etching a first layer underlying the photoresist layer.

14. The mask fabrication and repair technique of claim 13, wherein reducing defects includes protecting desired shapes of the transferred pattern.

15. The mask fabrication and repair technique of claim 14, wherein protecting includes one of under-processing during the step of developing and over-exposing during the step of exposing.

16. The mask fabrication and repair technique of claim 14, wherein using substantially the same technique includes providing alignment keys to minimize misalignment between exposures.

17. The mask fabrication and repair technique of claim 13, further including exposing a backside of the mask.

18. A mask for a lithographic process, the mask having minimal defects thereon, the mask comprising:
   a first layer; and
   a second layer formed on the first layer, wherein the second layer is patterned using multiple, substantially similar exposure techniques that remove an isolated defect and reduce a size of a defect proximate to a desired shape on the mask.

19. The mask of claim 18, wherein the multiple, substantially similar exposure techniques include:
   forming a first photoresist layer on the second layer;
   exposing the first photoresist layer based on a first pattern including a plurality of shapes;
   developing the first photoresist layer;
   etching the second layer, thereby transferring the pattern to the second layer;
   forming a second photoresist layer on the patterned second layer;
   exposing the second photoresist layer based on a second pattern associated with the first pattern;
   developing the second photoresist layer; and
   re-etching the second layer, thereby at least partially removing a defect on the mask.

20. A wafer having minimal defects therein, the wafer comprising:
   a first layer; and
   a second layer formed on the first layer, wherein the second layer is patterned using multiple, substantially similar exposure techniques that remove an isolated defect and reduce a size of a defect proximate to a desired shape on the wafer.

21. The wafer of claim 20, wherein the multiple, substantially similar exposure techniques include:
   forming a first photoresist layer on the second layer;
   exposing the first photoresist layer based on a first pattern including a plurality of shapes;
   developing the first photoresist layer;
   etching the second layer, thereby transferring the pattern to the second layer;
   forming a second photoresist layer on the patterned second layer;
   exposing the second photoresist layer based on a second pattern associated with the first pattern;
   developing the second photoresist layer; and
   re-etching the second layer, thereby at least partially removing a defect in the second layer.

22. The wafer of claim 21, wherein the second photoresist layer is a positive photoresist, wherein the second pattern is identical to the first pattern, and wherein developing includes under-processing the second photoresist layer, thereby exposing the defect.

23. The wafer of claim 22, further including aligning first and second exposures.

24. A method of minimizing defects when fabricating a wafer, the wafer including a first layer and a second layer formed on the first layer, wherein the first layer provides a stop-etch for the second layer, the method comprising:

forming a first photoresist layer on the second layer;
exposing the first photoresist layer based on a first pattern including a plurality of shapes;
developing the first photoresist layer, thereby defining critical dimensions of the plurality of shapes;
etching the second layer, thereby transferring the pattern to the second layer;
forming a second photoresist layer on the patterned second layer;
exposing the second photoresist layer based on a second pattern associated with the first pattern, wherein the second pattern is substantially identical to or opposite that of the first pattern;
developing the second photoresist layer; and
re-etching the second layer, thereby removing a defect on the second layer.

* * * * *